(12) United States Patent
Eckberg et al.

(10) Patent No.: US 9,351,428 B2
(45) Date of Patent: May 24, 2016

(54) BLIND DOCKING APPARATUS TO ENABLE LIQUID COOLING IN COMPUTE NODES

(71) Applicant: Lenovo Enterprise Solutions (Singapore) Pte. Ltd., Singapore (SG)

(72) Inventors: Eric A. Eckberg, Rochester, MN (US); Brian M. Kerrigan, Cary, NC (US); Robert M. Lindsay, Raleigh, NC (US); Michael S. Miller, Raleigh, NC (US); Derek I. Schmidt, Raleigh, NC (US); James S. Womble, Hillsborough, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 125 days.

(21) Appl. No.: 14/472,608

(22) Filed: Aug. 29, 2014

(65) Prior Publication Data

US 2016/0066480 A1    Mar. 3, 2016

(51) Int. Cl.
*F16L 37/26* (2006.01)
*F16L 37/30* (2006.01)
*H05K 7/20* (2006.01)
*F16L 37/34* (2006.01)

(52) U.S. Cl.
CPC ............ *H05K 7/20772* (2013.01); *F16L 37/26* (2013.01); *F16L 37/30* (2013.01); *F16L 37/34* (2013.01); *H05K 7/20272* (2013.01)

(58) Field of Classification Search
CPC  H05K 7/20772; H05K 7/20272; F16L 37/26; F16L 37/30; F16L 37/34
USPC ................. 137/614, 614.03–614.05
See application file for complete search history.

(56) References Cited

U.S. PATENT DOCUMENTS

| | | | |
|---|---|---|---|
| 3,774,636 A * | 11/1973 | Arita ................. | F16L 37/32 137/614.04 |
| 5,263,871 A | 11/1993 | Sano | |
| 6,407,923 B1 | 6/2002 | Gerlock et al. | |
| 6,860,290 B2 * | 3/2005 | Knuthson ............ | F16L 37/30 137/594 |

(Continued)

FOREIGN PATENT DOCUMENTS

EP        1448040 A2    8/2004

OTHER PUBLICATIONS

J.C. Parrilla et al., "Packaging the IBM eServer z990 central electronic complex", IBM J. Res. & Dev. vol. 48 No. 3/4 May/Jul. 2004, pp. 395-407.

*Primary Examiner* — Kevin Lee
(74) *Attorney, Agent, or Firm* — Katherine S. Brown; Jeffrey L. Streets

(57) ABSTRACT

An apparatus includes a rigid structure having first and second collars, a quick connect connector having first and second shoulders, and a spring biasing the connector toward an extended position with the first shoulder against the first collar and the second shoulder against the second collar. The first collar and the first shoulder form an inwardly and rearwardly angled contact surface there between, and the second collar and the second shoulder form an inwardly and rearwardly angled contact surface there between. The connector is centered in the first and second collars unless acted upon by a force overcoming the spring and pushing the connector to a retracted position with the first and second shoulders out of contact with the first and second collars. When retracted, the connector may adjust its position longitudinally, vertically, laterally or angularly to facilitate coupling with a mating fixed quick connect connector.

20 Claims, 4 Drawing Sheets

(56) References Cited

U.S. PATENT DOCUMENTS

| | | |
|---|---|---|
| 7,465,177 B2 | 12/2008 | Wood |
| 8,336,922 B2 * | 12/2012 | Tiberghien et al. ..... F16L 37/56 137/594 |
| 9,194,634 B2 * | 11/2015 | Tiberghien et al. ..... F28F 27/00 |
| 2011/0044010 A1 | 2/2011 | Ledezma et al. |
| 2012/0327602 A1 | 12/2012 | Kulkarni et al. |
| 2013/0322016 A1 | 12/2013 | Jones et al. |
| 2013/0344748 A1 | 12/2013 | Phan |

\* cited by examiner

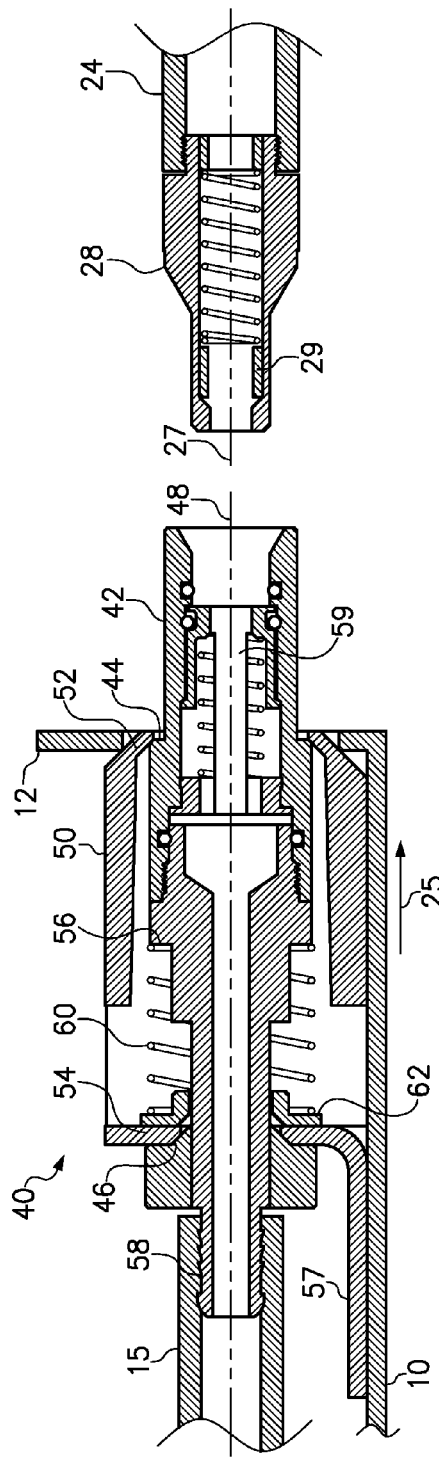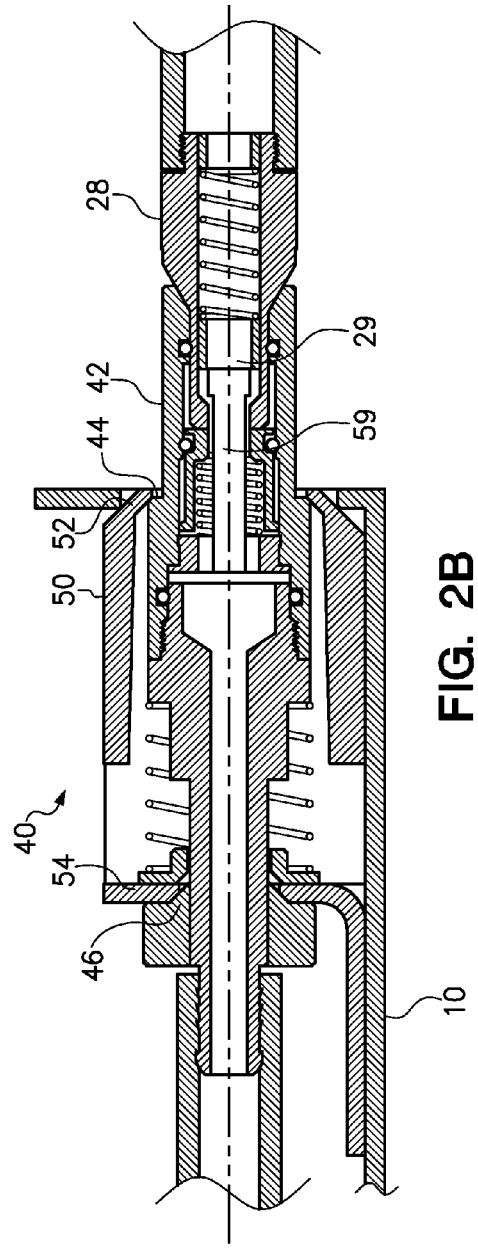

BLIND DOCKING APPARATUS TO ENABLE LIQUID COOLING IN COMPUTE NODES

BACKGROUND

1. Field of the Invention

The present invention relates to blind docking of fluidic conduits between a two components.

2. Background of the Related Art

Heat-generating computer system components, such as processors, are generally supported within a chassis, such as a server rack, to provide efficient storage and accessibility for component installation and removal. In high heat-density systems, a coolant such as water may be provided from a coolant source and flow through a supply conduit to one or more heat exchangers disposed within or adjacent to the chassis. The coolant may be continuously warmed at the one or more heat exchangers, and the warmed coolant may be returned to the coolant source through a return conduit or released without recirculation. Where warmed coolant is returned to the coolant source, the returned coolant may be cooled by a regenerator, such as a cooler or refrigeration system, so that the regenerated coolant may be circulated back through the supply conduit. The supply conduit and the release or return conduit are portions of a fluidic circuit.

In conventional fluidic circuits for coolant systems, the supply conduit and the release or return conduit may include fluidic couplings, such as mating threaded fittings or mating flanges, that facilitate the connection of fluid conduits that deliver the fluid to one or more heat exchangers in the chassis. Threaded and flanged fittings generally take a large amount of time and effort to make up (connect) and break out (disconnect). An alternate type of coupling is a quick disconnect coupling comprising a male insert that is releasably receivable in a female socket to sealably and fluidically couple a first portion of a conduit connected to the male insert to a second portion of a conduit connected to the female socket. Used in this manner, a first quick disconnect coupling may be used to connect a fluid coolant supply conduit to an inlet conduit to one or more heat exchangers within a chassis and a second quick disconnect coupling may be used to connect a fluid coolant release/return conduit to an outlet conduit from the one or more heat exchangers. In this manner, first and second quick disconnect couplings may be used to quickly provide a fluidic circuit to remove heat produced by heat-generating electronic components within the chassis.

Although connecting and disconnecting quick disconnect couplings requires less time than conventional fluidic couplings, a substantial amount of effort and time may still be required to make up a pair of quick disconnect couplings to enable the fluidic circuit, especially if the quick disconnect couplings are disposed in a location that is difficult to access such as at the back of a computer chassis. For example, a user may have to align a first male insert with a first female socket, insert the first male insert into the first female socket, secure the quick disconnect coupling by sliding a release collar on the female socket to a docked position, and then repeat the process on a second conduit to complete the fluid circuit.

BRIEF SUMMARY

One embodiment of the present invention provides an apparatus comprising a chassis and a compute node. The chassis includes a fluid supply conduit, a fluid return conduit, a first quick connect connector that is fluidically coupled to the fluid supply conduit, a second quick connect connector that is fluidically coupled to the fluid return conduit, and a bay configured to receive the compute node. The first and second quick connect connectors are secured in a fixed position at the back of the bay and are oriented in a forward direction into the bay. The compute node has a rearward end securing a first compliant connector assembly and a second compliant connector assembly, wherein the first compliant connector assembly includes a third quick connect connector oriented in a rearward direction so that installing the compute node within the bay provides nominal alignment of the third quick connect connector with the first quick connect connector, and wherein the second compliant connector assembly includes a fourth quick connect connector oriented in a rearward direction so that installing the compute node within the bay provides nominal alignment of the fourth quick connect connector with the second quick connect connector. The third quick connect connector has first and second shoulders and the fourth quick connect connector has first and second shoulders. The first compliant connector assembly includes a rigid structure having first and second collars, wherein the first collar and the first shoulder form an inwardly and rearwardly angled contact surface there between, and wherein the second collar and the second shoulder form an inwardly and rearwardly angled contact surface there between. The first compliant connector assembly further includes a first spring biasing the third quick connect connector in the rearward direction. Similarly, the second compliant connector assembly includes a rigid structure having first and second collars, wherein the first collar and the first shoulder form an inwardly and rearwardly angled contact surface there between, and wherein the second collar and the second shoulder form an inwardly and rearwardly angled contact surface there between. The second compliant connector assembly further includes a second spring biasing the fourth quick connect connector in the rearward direction.

Another embodiment of the present invention provides an apparatus comprising a compute node configured to be received within a chassis bay, and a first compliant connector assembly secured to a rearward end of the compute node. The first compliant connector assembly includes a rigid structure having first and second collars, a first quick connect connector having first and second shoulders, and a first spring biasing the first quick connect connector in the rearward direction. The first collar and the first shoulder of the first compliant connector assembly form an inwardly and rearwardly angled contact surface there between, wherein the second collar and the second shoulder of the first compliant connector assembly form an inwardly and rearwardly angled contact surface there between, and wherein the first quick connect connector is oriented in a rearward direction for blind mating with a second quick connect connector within the chassis bay.

Yet another embodiment of the present invention provides an apparatus comprising a rigid structure having first and second collars, a quick connect connector having first and second shoulders, and a spring biasing the quick connect connector toward an extended position with the first shoulder against the first collar and the second shoulder against the second collar. The first collar and the first shoulder form an inwardly and rearwardly angled contact surface there between, and the second collar and the second shoulder form an inwardly and rearwardly angled contact surface there between. The quick connect connector is centered in the first and second collars unless acted upon by a force overcoming the spring and pushing the quick connect connector to a retracted position with the first and second shoulders out of contact with the first and second collars.

BRIEF DESCRIPTION OF THE SEVERAL VIEWS OF THE DRAWINGS

FIG. 2A is a cross-sectional diagram of a compliant quick connect connector that is axially aligned for coupling to a mating fixed quick connect connector.

FIG. 2B is a cross-sectional diagram of the compliant quick connect connector coupled to the fixed quick connect connector of FIG. 2A to provide fluid communication there between.

FIG. 3B is a cross-sectional diagram of the compliant quick connect connector coupled to the fixed quick connect connector of FIG. 3A to provide fluid communication there between.

FIG. 4B is a cross-sectional diagram of the compliant quick connect connector coupled to the fixed quick connect connector of FIG. 4A to provide fluid communication there between.

DETAILED DESCRIPTION

Figure 1:
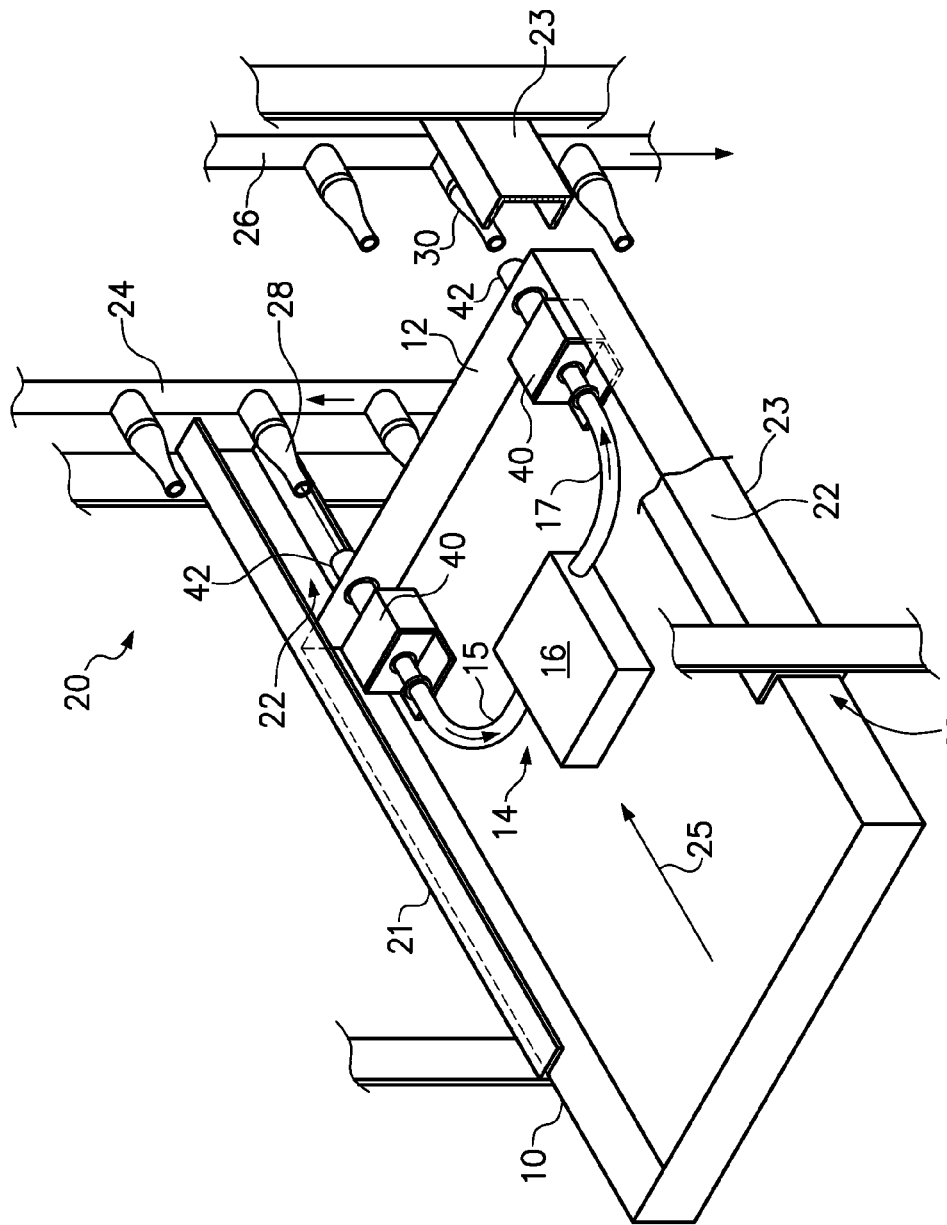
FIG. 1 is a perspective view of a compute node being installed into a bay of a chassis or rack in order to blind mate a pair of fluid couplings.

One embodiment of the present invention provides an apparatus comprising a chassis and a compute node. The chassis includes a fluid supply conduit, a fluid return conduit, a first quick connect connector that is fluidically coupled to the fluid supply conduit, a second quick connect connector that is fluidically coupled to the fluid return conduit, and a bay configured to receive the compute node. The first and second quick connect connectors are secured in a fixed position at the back of the bay and are oriented in a forward direction into the bay. The compute node has a rearward end securing a first compliant connector assembly and a second compliant connector assembly, wherein the first compliant connector assembly includes a third quick connect connector oriented in a rearward direction so that installing the compute node within the bay provides nominal alignment of the third quick connect connector with the first quick connect connector, and wherein the second compliant connector assembly includes a fourth quick connect connector oriented in a rearward direction so that installing the compute node within the bay provides nominal alignment of the fourth quick connect connector with the second quick connect connector. The third quick connect connector has first and second shoulders and the fourth quick connect connector has first and second shoulders. The first compliant connector assembly includes a rigid structure having first and second collars, wherein the first collar and the first shoulder form an inwardly and rearwardly angled contact surface there between, and wherein the second collar and the second shoulder form an inwardly and rearwardly angled contact surface there between. The first compliant connector assembly further includes a first spring biasing the third quick connect connector in the rearward direction. Similarly, the second compliant connector assembly includes a rigid structure having first and second collars, wherein the first collar and the first shoulder form an inwardly and rearwardly angled contact surface there between, and wherein the second collar and the second shoulder form an inwardly and rearwardly angled contact surface there between. The second compliant connector assembly further includes a second spring biasing the fourth quick connect connector in the rearward direction.

Quick connect couplings are well-known couplings that allow quick and easy connections, such as between two fluid conduits. A first fluid conduit terminates in a first quick connect connector and a second fluid conduit terminates in a second quick connect connector that mates with first quick connect connector in order to provide fluid communication between the first and second fluid conduits. In one example, a compute node includes a cooling circuit coupled between two quick connect connectors that may blind mate with two mating quick connect connectors secured to a fluid supply manifold and a fluid return manifold, respectively. A typically cooling circuit may include a fluid cooled heat exchanger in thermal contact with a heat-generating device, such as a microprocessor.

The two quick connect connectors of a quick connect coupling are typically dissimilar but complimentary, such as one male connector and one female connector. Typically, male and female quick connect connectors may be coupled together regardless of the direction of fluid flow or the direction of movement of one connector to the other connector. Accordingly, in the present examples, the male and female quick connect connectors will be equally operable if their positions are reversed. Most preferably, each of the quick connect connectors will include an automatic shut off valve that prevents fluid flow when disconnected.

The rigid structure of the first and second quick compliant connector assemblies may take various forms so long as the rigid structure may be secured to the compute node and form the first and second collars. For example, the rigid structure may form a housing or casing around a quick connect connector. Optionally, each of the first and second collars may form an inwardly and rearwardly angled surface, such as a frustoconical surface.

In one preferred configuration, the quick connect connector is centered in the first and second collars of the compliant connector assembly unless acted upon by a force overcoming the spring and pushing the first and second shoulders of the quick connect connector out of contact with the first and second collars of the compliant connector assembly.

In another preferred configuration, the quick connect connector is allowed to tilt to various angles in order to align with a mating quick connect connector despite any initial misalignment between the two mating quick connect connectors. The range of angles is determined by the spacing between the collars/shoulders, as well as the relative dimensions of the quick connect connector and the collars. For example, when the quick connect connector is in a retracted position, the compliant connector assembly may allow the quick connect connector to move in a lateral direction, vertical direction, longitudinal direction and at an angle relative to a longitudinal axis defined by an extended position of the quick connect connector.

Optionally, the compute nodes may share common chassis power supplies, fans, and midplane, and have a known "blade" style of system architecture. Many of these shared features may be provided from the rear of the chassis along with the fluid supply and return conduits. As multiple compute nodes are packaged into a chassis or rack the main vertical "trunk" cooling lines may be routed vertically from bottom to the top of the rack. These lines are large and heavy and are best placed at the rear of the rack. This location allows them to remain stationary and affords the ability to assemble, remove, or service each compute node from the customary front location of the rack. Since the compliant connector assembly is affixed to the compute node itself, the compliant connector assembly can be quickly and easily serviced by removing the compute node from the chassis.

Another embodiment of the present invention provides an apparatus comprising a compute node configured to be received within a chassis bay, and a first compliant connector assembly secured to a rearward end of the compute node. The first compliant connector assembly includes a rigid structure having first and second collars, a first quick connect connector having first and second shoulders, and a first spring biasing the first quick connect connector in the rearward direction. The first collar and the first shoulder of the first compliant connector assembly form an inwardly and rearwardly angled contact surface there between, wherein the second collar and the second shoulder of the first compliant connector assembly form an inwardly and rearwardly angled contact surface there between, and wherein the first quick connect connector is oriented in a rearward direction for blind mating with a second quick connect connector within the chassis bay. Optionally, the apparatus may further comprise a second compliant connector assembly secured to the rearward end of the compute node, wherein the second compliant connector assembly includes a rigid structure having first and second collars, a third quick connect connector having first and second shoulders, and a second spring biasing the third quick connect connector in the rearward direction. The first collar and the first shoulder of the second compliant connector assembly may form an inwardly and rearwardly angled contact surface there between, and the second collar and the second shoulder of the second compliant connector assembly may form an inwardly and rearwardly angled contact surface there between, wherein the third quick connect connector is oriented in a rearward direction for blind mating with a fourth quick connect connector within the chassis bay. Still further, the apparatus may include or implement any one or more additional feature described in regard to other embodiments disclosed herein.

Yet another embodiment of the present invention provides an apparatus comprising a rigid structure having first and second collars, a quick connect connector having first and second shoulders, and a spring biasing the quick connect connector toward an extended position with the first shoulder against the first collar and the second shoulder against the second collar. The first collar and the first shoulder form an inwardly and rearwardly angled contact surface there between, and the second collar and the second shoulder form an inwardly and rearwardly angled contact surface there between. The quick connect connector is centered in the first and second collars unless acted upon by a force overcoming the spring and pushing the quick connect connector to a retracted position with the first and second shoulders out of contact with the first and second collars. Optionally, each of the first and second collars may form an inwardly and rearwardly angled surface, such as a frustoconical surface.

Embodiments of the present invention provide a compliant connector assembly that includes a quick connect connector that is in an initially fixed position to facilitate initiate engagement with a mating connector (without binding) and then is released to float or move upon initial force from the mating connector. The compliant connector facilitates a blind docking or blind mating fluid coupling that allows for angular and linear misalignment between mating quick connect connectors. In other words, the compliant connector assembly provides initial nominal axial alignment between mating quick connect connectors, but allows for some initial misalignment by allowing the quick connect connector to move in response to forces applied as the two connectors are pushed together.

FIG. 1 is a perspective view of a compute node 10 being installed into a bay 22 of a chassis 20 or rack in order to blind mate a pair of fluid couplings. The bay 22 is configured to receive the compute node 10, such as using side rails 21, 23 that constrain the compute node 10 to slide in a rearward direction (see arrow 25) and provide nominal alignment of certain quick connect connectors.

The chassis 20 includes a fluid supply conduit 24, a fluid return conduit 26, a first quick connect connector 28 that is fluidically coupled to the fluid supply conduit 24, a second quick connect connector 30 that is fluidically coupled to the fluid return conduit 26. The first and second quick connect connectors 28, 30 are secured in a fixed position at the back of the bay 22 and are oriented in a forward direction into the bay 22. The compute node 10 has a rearward end 12 securing a first and second compliant connector assemblies 40. Each compliant connector assembly 40 includes a quick connect connector 42 oriented in a rearward direction so that installing the compute node 10 within the bay 22 provides nominal alignment of the quick connect connectors 42 on the compute node 10 with the quick connect connectors 28, 30 on the fluid supply and return conduits 24, 26.

The compute node 10 also includes a cooling fluid circuit 14 that includes a fluid supply tube 15, a fluid return tube 17, and a fluid-cooled heat exchanger 16 fluidically coupled between the fluid supply tube 15 and the fluid return tube 17. A cooling fluid, such as chilled water, may pass through the heat exchanger 16 to cool a heat-generating component, such as a microprocessor (not shown), in thermal contact communication with the heat exchanger 16. Typically, the heat-generating component will be in direct contact with the heat exchanger. Once the mating quick connect connectors 28, 42 are coupled to supply the cooling fluid and the mating quick connector connectors 30, 42 are coupled to return the warmed fluid, then the cooling fluid circuit is operational. For example, a cooling fluid from a chilled fluid source (not shown) is supplied to the fluid supply conduit or manifold 24. The cooling fluid may then flow through the mated connectors 28, 42, through the fluid supply tube 15 to the heat exchanger 16 where heat from the heat-generating component is transferred into the cooling fluid, which becomes warm. The warmed fluid passes out of the heat exchanger 16, through the fluid return tube 17, and through the mated connectors 30, 42 to the fluid return conduit 26 before being discarded or returned to the chilled fluid source.

It should be noted that other components and features of a compute node 10 and a chassis 20 are not shown, but may still be included. For example, the rear end 12 of the compute node 10 may include one or more electronic connectors for blind mating with one or more mating electronic connectors of the chassis 20. Optionally, the chassis 20 may include a midplane including connectors for blind mating with a plurality of compute nodes across a plurality of bays formed in the chassis 20, where each bay preferably includes quick connect connectors 28, 30.

FIG. 2A is a cross-sectional diagram of a compliant connector assembly 40 including a quick connect connector 42 that is axially aligned for coupling to a mating fixed quick connect connector 28. The quick connect connector 42 has a first shoulder 44 and a second shoulder 46, and the compliant connector assembly 40 includes a rigid structure 50 having a first collar 52 and a second collar 54. The distance between the first and second shoulders 44, 46 is the same as the distance between the first and second collars 52, 54, such that the first shoulder 44 can contact the first collar 52 at the same time that the second shoulder 46 contacts the second collar 54.

The first collar 52 and the first shoulder 44 form an inwardly and rearwardly angled contact surface there between, and the second collar 54 and the second shoulder 46 form an inwardly and rearwardly angled contact surface there between. As shown, it is not necessary for both the collar and the shoulder that contacts the collar to be angled inwardly and rearwardly, although this is shown between the second collar 54 and the second shoulder 46. Alternatively, an inwardly and rearwardly angled contact surface may be formed between a collar is angled and a shoulder that is squared off (or some other shape), as shown by the second collar 52 and the second shoulder 44, or between a collar that is squared off (or some other shape) and a shoulder that is angled. The important feature is that the collar and shoulder form an inwardly and rearwardly angled contact surface there between, such that the quick connect connector 42 is secured when in an extended position as shown in FIG. 2A. Optionally, the quick connect connector 42 may be positioned in a manner that the connector may be described as being "centered" within the collars 52, 54.

The compliant connector assembly 40 further includes a spring 60 biasing the quick connect connector 42 in the rearward direction (see arrow 25). The spring 60 is shown in the form of a compression spring disposed between a spring shoulder 56 on the quick connect connector 42 and a spring seat 62 that slidably contacts the rigid structure 50 around the second collar 54. Accordingly, the spring 60 biases the quick connect connector 42 in a rearward direction (see arrow 25), such that the first shoulder 44 is pushed against the first collar 52, and the second shoulder 46 is pushed against the second collar 54. Due to the inwardly and rearwardly angled contact surfaces formed between the shoulders and collars, the shoulders move to an extended position. As shown, in FIG. 2A, the extended position moves the quick connect connector 42 to a "centered" position.

The quick connect connector 42 in the compliant connector assembly 40 is shown as a female connector and the quick connect connector 28 secured to the fluid supply conduit 24 is shown as a male connector. It should be recognized that the male and female connectors may be reversed, such that the male connector is on the compliant connector assembly and the female connector is on the fluid supply conduit. Furthermore, both of the quick connect connectors 28, 42 are shown having automatic shut off valves 29, 59, but the details of quick connect connectors with automatic shut off valves is known to those having ordinary skill in the art and is not repeated here.

The compliant connector assembly 40 is secured to the compute node 10 via a bracket 57 that is attached to, or forms part of, the rigid structure 50. As shown, the compliant connector assembly 40 is positioned so that the quick connect connector 42 extends from the back end 12 of the compute node 10. Still further, the quick connect connector 42 is shown including a fitting 58 for securing a fluid tubing, such as the fluid supply tube 15. Although the two quick connect connectors 28, 42 are not coupled together, an axial center line 48 of the quick connect connector 42 is aligned with the axial center line 27 of the quick connect connector 28.

FIG. 2B is a cross-sectional diagram of the quick connect connector 42 coupled to the fixed quick connect connector 28 of FIG. 2A to provide fluid communication there between. As a result of the compute node 10 being moved in the rearward direction in the chassis bay, the connectors 28, 42 engage to form a fluid seal between the connectors and cause the automatic shut off valves 29, 59 to open.

Since the two quick connect connectors 28, 42 were precisely axially aligned and precisely spaced apart prior to connection, the connectors 28, 42 were able to be coupled without the shoulders 44, 46 necessarily disengaging from the collars 52, 54. The figures below detail situations where the connectors are not precisely axially aligned or spaced apart.

Figure 3A:
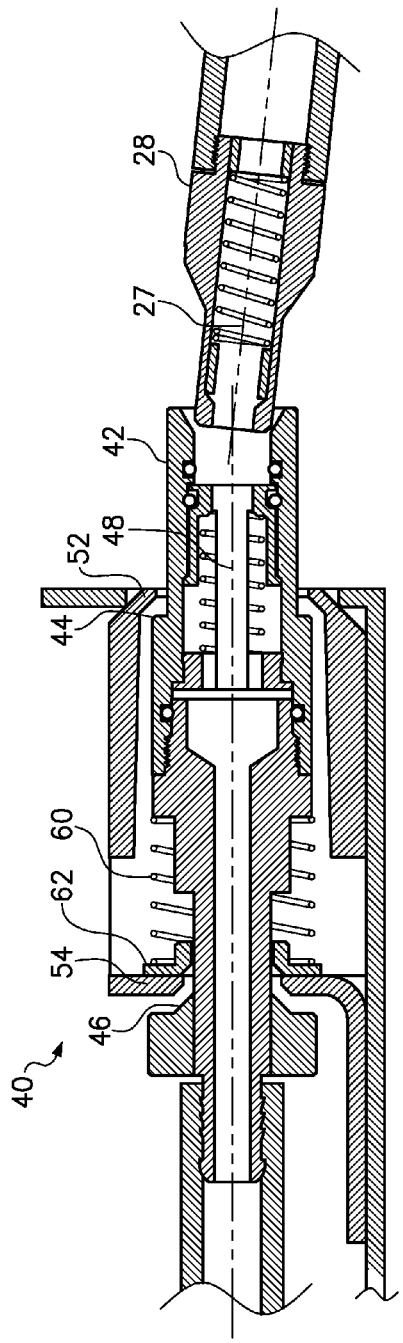
FIG. 3A is a cross-sectional diagram of a compliant quick connect connector that is angularly misaligned with a mating fixed quick connect connector.

FIG. 3A is a cross-sectional diagram of the compliant connector assembly 40 having a quick connect connector 42 that is angularly misaligned with a mating fixed quick connect connector 28. Within a range of dimensional tolerance, the connectors 28, 42 make initial contact and the leading end of the male connector enters a portion of the opening in the female connector. However, due to the axial misalignment, the connectors 28, 42 are unable to couple in this position. Under additional force applied on the compute node 10 to push the node into the bay, the "fixed" connector 28 pushes back on the "floating" connector 42 with sufficient force to overcome the biasing force in the spring 60 (compress the spring) and retract the floating connector 42 in a longitudinal direction (toward the left as shown in FIG. 3A). In the retracted position, the first shoulder 44 has disengaged the first collar 52, and the second shoulder 46 has disengaged the second collar 54, such that the connector 42 may be said to "float". Accordingly, since the portions of the quick connect connector 42 that now extend through the collars 52, 54 have dimensions that are smaller than the shoulders 44, 46, there is freedom for the quick connect connector 42 to move in two dimensions (vertically and laterally). Furthermore, since the two (proximal and distal) portions of the connector 42 are not constrained to move in the same direction, the floating connector 42 may move to adjust the angle of its axial centerline 48, within physical limits established by the collars, to match the angle of the axial centerline 27 of the fixed connector 28.

Figure 3B:
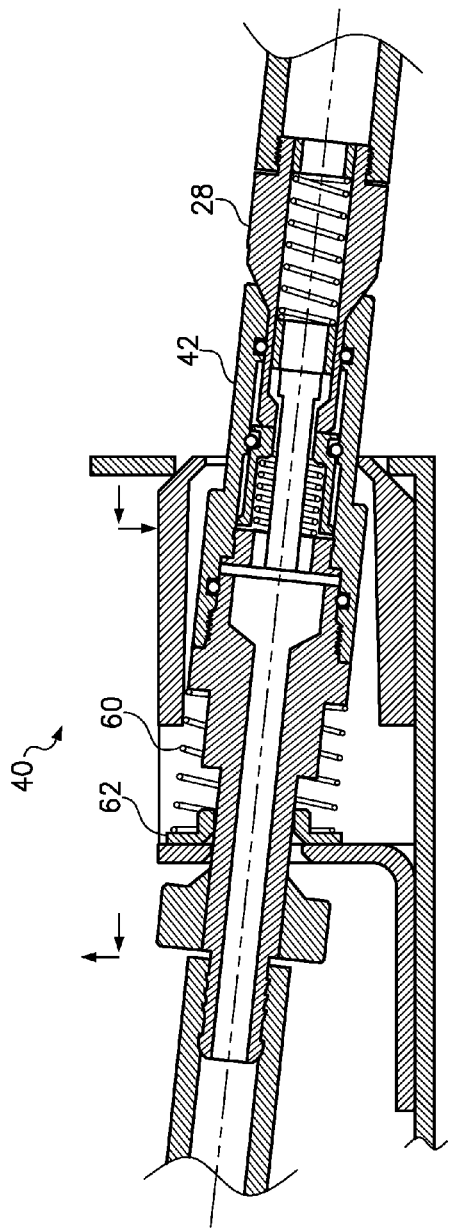

FIG. 3B is a cross-sectional diagram of the compliant connector assembly 40 with the floating quick connect connector 42 coupled to the fixed quick connect connector 28 of FIG. 3A to provide fluid communication there between. While the fixed connector 28 has stayed in the same position and angle, the rearward end of the floating connector 42 has moved vertically lower, the proximal end of the floating connector 42 has moved vertically upward, and the entire floating connector 42 has moved longitudinally further in a retraction direction (leftward in FIG. 3B). The spring 60 is highly compressed and the spring seat 62 has moved upward along with the proximal end of the floating connector 42. In other details, the connectors 28, 42 operate in the same manner as in FIG. 2A and FIG. 2B. Furthermore, when the connectors 28, 42 are decoupled, the spring 60 will cause the floating connector 42 to return to the position shown in FIG. 2A.

Figure 4A:
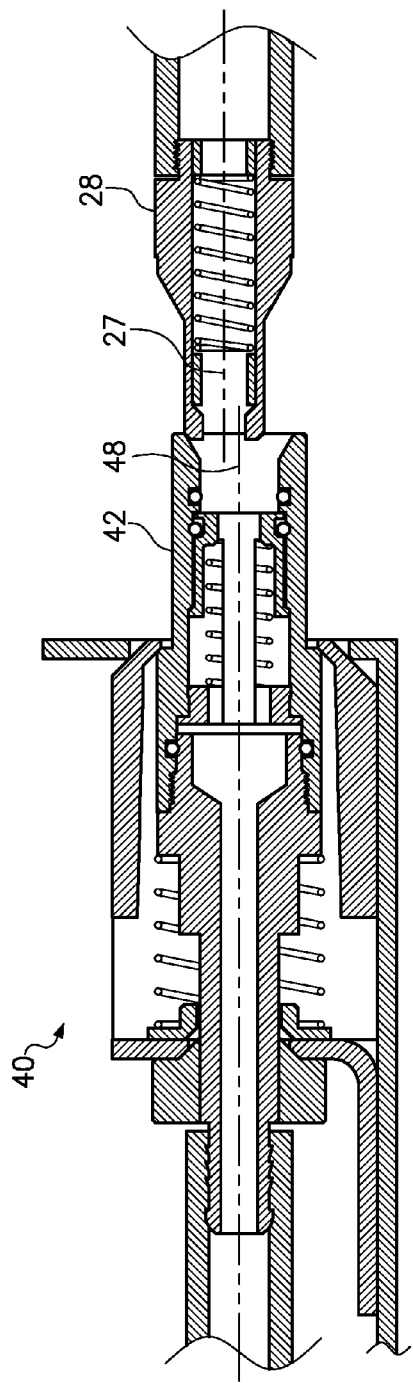
FIG. 4A is a cross-sectional diagram of a compliant quick connect connector that is vertically misaligned with a mating fixed quick connect connector.

FIG. 4A is a cross-sectional diagram of the compliant connector assembly 40 having a floating quick connect connector 42 that is vertically misaligned (offset) with a mating fixed quick connect connector 28. While the axial centerlines 48, 27 are parallel, they are offset by a distance, such that the fixed connector 28 is vertically elevated relative to the floating connector 42. At the point of initial contact as shown, the connectors 28, 42 make contact and engage such that the leading end of the fixed male connector 28 enters the opening in the floating female connector 42. However, without an adjustment in the alignment of the connectors 28, 42, the coupling cannot be completed.

Figure 4B:
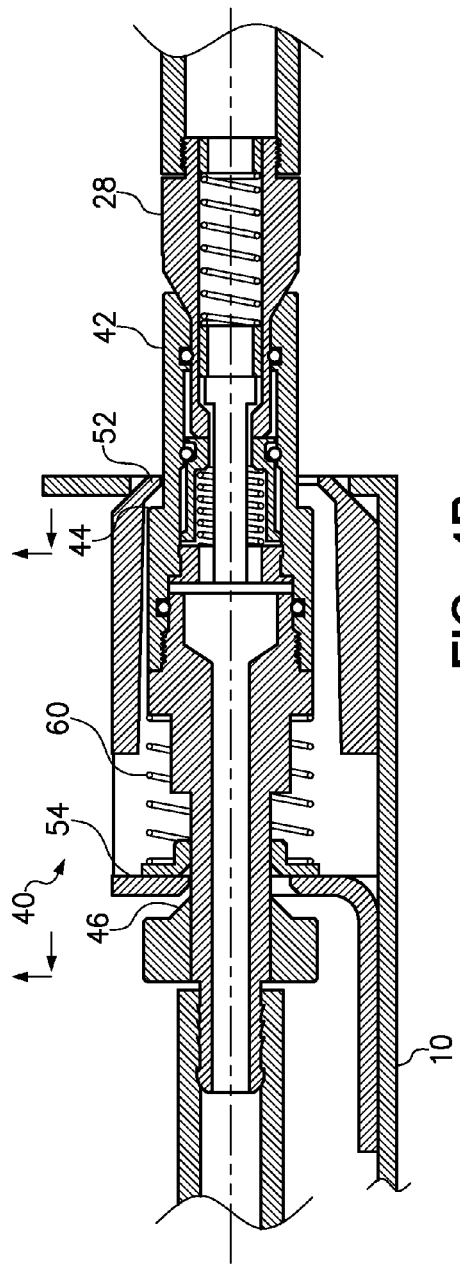

FIG. 4B is a cross-sectional diagram of the compliant connector assembly 40 with the floating quick connect connector 42 coupled to the fixed quick connect connector 28 of FIG. 4A to provide fluid communication there between. As shown, the first shoulder 44 has disengaged the first collar 52, and the second shoulder 46 has disengaged the second collar 54. However, the insertion forces on the compute node 10 cause the both the proximal and distal portions of the floating connector 42 to move vertically upward to account for the initial offset between the connectors 28, 42. This and other misalignments may be tolerated in accordance with one or more embodiment of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:
    a chassis including a fluid supply conduit, a fluid return conduit, a first quick connect connector that is fluidically coupled to the fluid supply conduit, a second quick connect connector that is fluidically coupled to the fluid return conduit, and a bay configured to receive a compute node, wherein the first and second quick connect connectors are secured in a fixed position at a back of the bay and oriented in a forward direction into the bay;
    a compute node having a rearward end securing a first compliant connector assembly and a second compliant connector assembly, wherein the first compliant connector assembly includes a third quick connect connector oriented in a rearward direction so that installing the compute node within the bay provides nominal alignment of the third quick connect connector with the first quick connect connector, and wherein the second compliant connector assembly includes a fourth quick connect connector oriented in a rearward direction so that installing the compute node within the bay provides nominal alignment of the fourth quick connect connector with the second quick connect connector;
    wherein the first compliant connector assembly includes a rigid structure having first and second collars, wherein the third quick connect connector has first and second shoulders, wherein the first collar and the first shoulder form an inwardly and rearwardly angled contact surface there between, wherein the second collar and the second shoulder form an inwardly and rearwardly angled contact surface there between, and wherein the first compliant connector assembly further includes a first spring biasing the third quick connect connector in the rearward direction; and
    wherein the second compliant connector assembly includes a rigid structure having first and second collars, wherein the fourth quick connect connector has first and second shoulders, wherein the first collar and the first shoulder form an inwardly and rearwardly angled contact surface there between, wherein the second collar and the second shoulder form an inwardly and rearwardly angled contact surface there between, and wherein the second compliant connector assembly further includes a second spring biasing the fourth quick connect connector in the rearward direction.

2. The apparatus of claim 1, wherein the first and second collars each form an inwardly and rearwardly angled surface.

3. The apparatus of claim 2, wherein the first and second collars each form a frustoconical surface.

4. The apparatus of claim 1, wherein the third quick connect connector is centered in the first and second collars of the first compliant connector assembly unless acted upon by a force overcoming the first spring and pushing the first and second shoulders of the third quick connect connector out of contact with the first and second collars of the first compliant connector assembly; and
    wherein the fourth quick connect connector is centered in the first and second collars of the second compliant connector assembly unless acted upon by a force overcoming the first spring and pushing the first and second shoulders of the fourth quick connect connector out of contact with the first and second collars of the second compliant connector assembly.

5. The apparatus of claim 1, wherein the third quick connect connector is allowed to tilt to various angles in order to align with the first quick connect connector despite any initial misalignment between the first and third quick connect connectors; and
    wherein the fourth quick connect connector is allowed to tilt to various angles in order to align with the second quick connect connector despite any initial misalignment between the second and fourth quick connect connectors.

6. The apparatus of claim 1, wherein, when the third quick connect connector is in a retracted position, the first compliant connector assembly allows the third quick connect connector to move in a lateral direction, vertical direction, longitudinal direction and at an angle relative to a longitudinal axis defined by an extended position of the third quick connect connector; and
    wherein, when the fourth quick connect connector is in a retracted position, the first compliant connector assembly allows the fourth quick connect connector to move in a lateral direction, vertical direction, longitudinal direction and at an angle relative to a longitudinal axis defined by an extended position of the fourth quick connect connector.

7. The apparatus of claim 1, wherein the compute node includes a cooling circuit coupled between the third and fourth quick connect connectors.

8. The apparatus of claim 1, wherein each of the quick connect connectors include an automatic shut off valve that prevent fluid flow when disconnected.

9. An apparatus comprising:
    a compute node configured to be received within a chassis bay; and
    a first compliant connector assembly secured to a rearward end of the compute node, wherein the first compliant connector assembly includes a rigid structure having first and second collars, a first quick connect connector having first and second shoulders, and a first spring biasing the first quick connect connector in the rearward direction, wherein the first collar and the first shoulder of the first compliant connector assembly form an inwardly and rearwardly angled contact surface there between, wherein the second collar and the second shoulder of the first compliant connector assembly form an inwardly and rearwardly angled contact surface there between, and wherein the first quick connect connector is oriented in a rearward direction for blind mating with a second quick connect connector within the chassis bay.

10. The apparatus of claim 9, further comprising:
a second compliant connector assembly secured to the rearward end of the compute node, wherein the second compliant connector assembly includes a rigid structure having first and second collars, a third quick connect connector having first and second shoulders, and a second spring biasing the third quick connect connector in the rearward direction, wherein the first collar and the first shoulder of the second compliant connector assembly form an inwardly and rearwardly angled contact surface there between, wherein the second collar and the second shoulder of the second compliant connector assembly form an inwardly and rearwardly angled contact surface there between, and wherein the third quick connect connector is oriented in a rearward direction for blind mating with a fourth quick connect connector within the chassis bay.

11. The apparatus of claim 9, wherein the compute node includes a cooling circuit coupled between the first and second quick connect connectors.

12. The apparatus of claim 9, wherein the first and second collars each form an inwardly and rearwardly angled surface.

13. The apparatus of claim 12, wherein the first and second collars each form a frustoconical surface.

14. The apparatus of claim 9, wherein the first quick connect connector is centered in the first and second collars of the first compliant connector assembly unless acted upon by a force overcoming the first spring and pushing the first and second shoulders of the first quick connect connector out of contact with the first and second collars of the first compliant connector assembly.

15. The apparatus of claim 9, wherein the first quick connect connector is allowed to tilt to various angles in order to align with the second quick connect connector despite any initial misalignment between the first and second quick connect connectors.

16. The apparatus of claim 9, wherein, when the first quick connect connector is in a retracted position, the first compliant connector assembly allows the first quick connect connector to move in a lateral direction, vertical direction, longitudinal direction and at an angle relative to a longitudinal axis defined by an extended position of the first quick connect connector.

17. The apparatus of claim 9, wherein the first and second quick connect connectors each include an automatic shut off valve that prevents fluid flow when disconnected.

18. An apparatus comprising:
a rigid structure having first and second collars;
a quick connect connector having first and second shoulders; and
a spring biasing the quick connect connector toward an extended position with the first shoulder against the first collar and the second shoulder against the second collar, wherein the first collar and the first shoulder form an inwardly and rearwardly angled contact surface there between, wherein the second collar and the second shoulder form an inwardly and rearwardly angled contact surface there between, wherein the quick connect connector is centered in the first and second collars unless acted upon by a force overcoming the spring and pushing the quick connect connector to a retracted position with the first and second shoulders out of contact with the first and second collars.

19. The apparatus of claim 18, wherein the first and second collars each form an inwardly and rearwardly angled surface.

20. The apparatus of claim 19, wherein the first and second collars each form a frustoconical surface.

* * * * *